(12) United States Patent
Mimura et al.

(10) Patent No.: US 12,197,121 B2
(45) Date of Patent: Jan. 14, 2025

(54) PHASE SHIFT MASK BLANK, MANUFACTURING METHOD OF PHASE SHIFT MASK, AND PHASE SHIFT MASK

(71) Applicant: Shin-Etsu Chemical Co., Ltd., Tokyo (JP)

(72) Inventors: Shohei Mimura, Joetsu (JP); Naoki Matsuhashi, Joetsu (JP); Takuro Kosaka, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/502,488

(22) Filed: Oct. 15, 2021

(65) Prior Publication Data
US 2022/0137502 A1     May 5, 2022

(30) Foreign Application Priority Data
Oct. 30, 2020 (JP) ................. 2020-181972

(51) Int. Cl.
*G03F 1/32* (2012.01)
(52) U.S. Cl.
CPC ..................... *G03F 1/32* (2013.01)
(58) Field of Classification Search
CPC ........................................................ G03F 1/32
See application file for complete search history.

(56) References Cited

U.S. PATENT DOCUMENTS

| | | | |
|---|---|---|---|
| 5,474,864 A | 12/1995 | Isao et al. | |
| 5,561,009 A * | 10/1996 | Mohri | G03F 1/26 |
| | | | 428/209 |
| 2005/0026345 A1* | 2/2005 | Adetutu | H01L 21/823842 |
| | | | 257/E21.637 |
| 2007/0020534 A1 | 1/2007 | Yoshikawa et al. | |
| 2007/0212618 A1 | 9/2007 | Yoshikawa et al. | |
| 2013/0288163 A1 | 10/2013 | Fukaya | |

(Continued)

FOREIGN PATENT DOCUMENTS

| | | |
|---|---|---|
| JP | 7-140635 A | 6/1995 |
| JP | 2007-33469 A | 2/2007 |
| JP | 2007-233179 A | 9/2007 |

(Continued)

OTHER PUBLICATIONS

English machine translation of WO-2020066590-A1 (Apr. 2020) (Year: 2020).*

(Continued)

*Primary Examiner* — Sean M DeGuire
*Assistant Examiner* — Jayson D Cosgrove
(74) *Attorney, Agent, or Firm* — Birch, Stewart, Kolasch & Birch, LLP

(57) ABSTRACT

A phase shift mask blank including a transparent substrate, an etching protection film formed on the transparent substrate, and a phase shift film formed in contact with the etching protection film, for exposure light being ArF excimer laser. The etching protection film is composed of a material containing hafnium and oxygen or hafnium, silicon and oxygen, and has a thickness of 1 to 30 nm, and a transmittance of not less than 85% with respect the exposure light, and the phase shift film is composed of a material containing silicon and being free of hafnium, and has a thickness of 50 to 90 nm.

19 Claims, 5 Drawing Sheets

(56) References Cited

U.S. PATENT DOCUMENTS

2016/0291451 A1* 10/2016 Nam .................. G03F 1/58
2022/0035235 A1    2/2022 Ohkubo et al.

FOREIGN PATENT DOCUMENTS

| JP | 2007-241065 A | 9/2007 | |
| JP | 2013-228579 A | 11/2013 | |
| WO | WO-2019225737 A1 * | 11/2019 | ............... G03F 1/24 |
| WO | WO-2020066590 A1 * | 4/2020 | ............. C23C 14/04 |

OTHER PUBLICATIONS

English machine translation of WO-2019225737-A1 (Nov. 2019) (Year: 2019).*
Extended European Search Report for European Application No. 21203966.3, dated Mar. 16, 2022.

* cited by examiner

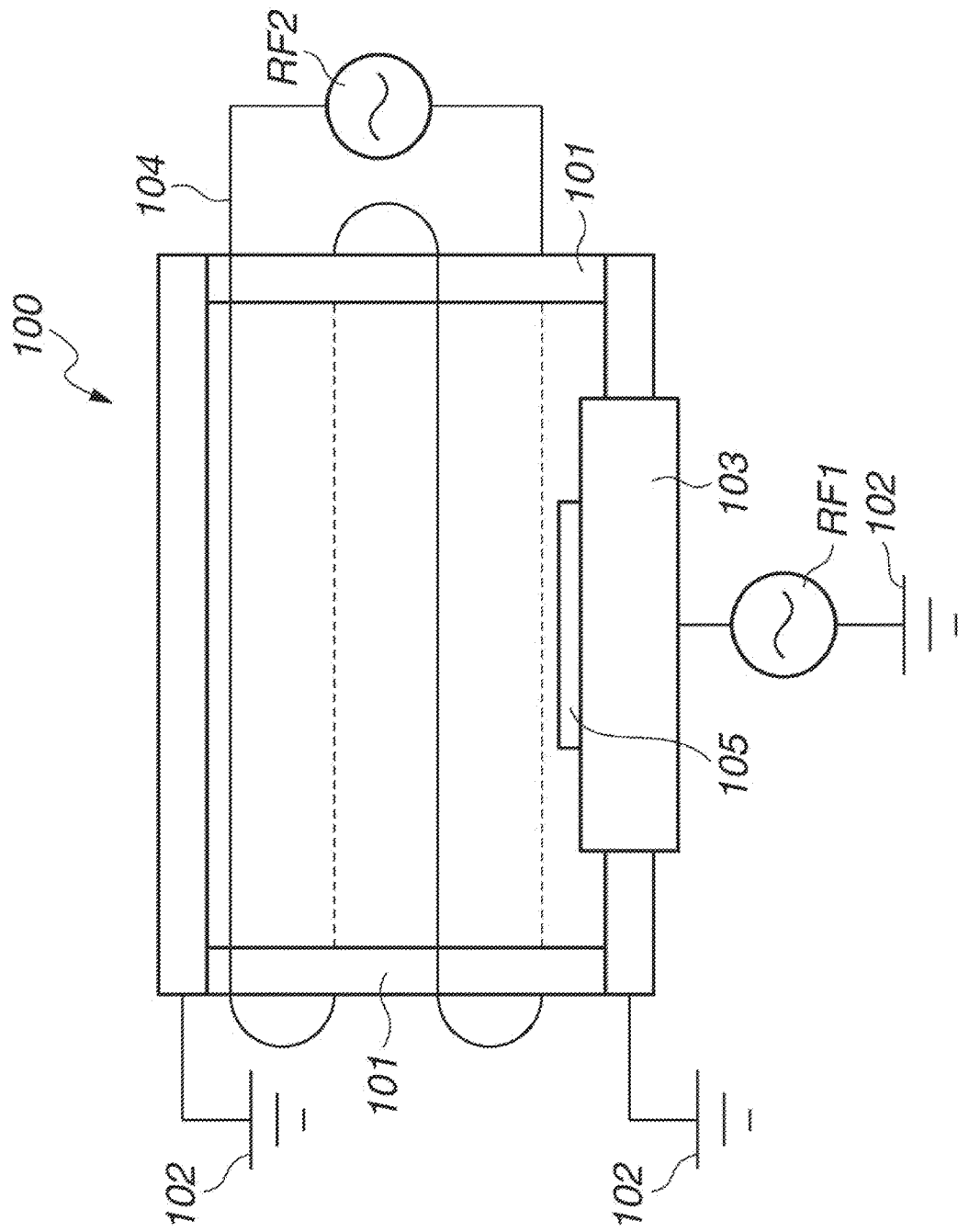

PHASE SHIFT MASK BLANK, MANUFACTURING METHOD OF PHASE SHIFT MASK, AND PHASE SHIFT MASK

CROSS-REFERENCE TO RELATED APPLICATION

This non-provisional application claims priority under 35 U.S.C. § 119(a) on Patent Application No. 2020-181972 filed in Japan on Oct. 30, 2020, the entire contents of which are hereby incorporated by reference.

TECHNICAL FIELD

The invention relates to a phase shift mask blank, typically used for manufacturing a semiconductor integrated circuit, a manufacturing method of a phase shift mask, and a phase shift mask.

BACKGROUND ART

In a photolithography technique used in a semiconductor technology, a phase shift method is used as one of a resolution enhancement technology. The phase shift method is, for example, a method using a photomask in which a phase shift film is formed on a substrate, and is a contrast enhancing method by forming a phase shift film pattern on a transparent substrate which is transparent to exposure light, and utilizing interference of lights. The phase shift film pattern has a phase shift of approximately 180 degrees that is a difference between a phase through the phase shift film and a phase through a portion where the phase shift film is not formed, in other word, a phase through air having a length same as the thickness of the phase shift film.

A halftone phase shift mask is one of the photomasks employing such method.

The halftone phase shift mask includes a substrate such as a quartz substrate which is transparent to exposure light, and a mask pattern of a halftone phase shift film which is formed on the substrate and has a phase shift of approximately 180 degrees to a phase through a portion where the phase shift film is not formed, and a transmittance substantively insufficient to contribute to exposure. Until now, as a phase shift film for a phase shift mask, a film containing molybdenum and silicon (a MoSi-based phase shift film) is mostly used (JP-A H07-140635 (Patent Document 1)).

CITATION LIST

Patent Document 1: JP-A H07-140635
Patent Document 2: JP-A 2007-33469
Patent Document 3: JP-A 2007-233179
Patent Document 4: JP-A-2007-241065

DISCLOSURE OF INVENTION

In a phase shift mask including a MoSi-based phase shift film, when a pattern of the phase shift film is formed, a dry etching using a fluorine-based gas is generally applied. However, the etching of the MoSi-based phase shift film is reached to a transparent substrate, the transparent substrate is also slightly etched by the dry etching using a fluorine-based gas. In such case, depending on the degree of etching of the transparent substrate, a difference from the setting in a phase shift occurs between the portion formed the phase shift film and the portion not formed the phase shift film in the obtained phase shift mask. Therefore, it is difficult to control the phase shift of the phase shift mask accurately. Further, if a pattern defect occurs in the phase shift film, it is difficult to correct the defect in the MoSi-based phase shift film formed on the transparent substrate.

As a phase shift mask blank for dealing with such problem, for example, a phase shift mask blank in which a film having different etching properties to a film containing silicon such as a chromium-based film, as an etching stopper film, is formed at the transparent substrate side of the MoSi-based phase shift film which is the film containing silicon is considered. In the phase shift mask blank using such an etching stopper film, generally, a chromium-based film as an etching mask film that functions as a hard mask when a light shielding film or a MoSi phase shift film is etched is formed at the side remote from the transparent substrate of the MoSi-based phase shift film. In this case, the chromium-based film at the transparent substrate side, which has been exposed by etching of the silicon-containing film, is etched at the same time when the chromium-based film on the phase shift film (at the side remote from the substrate) is removed by a chlorine-based gas.

However, when the etching stopper film is a chromium-based film, it is difficult to set a high transmittance with respect to the exposure light. Particularly, in the phase shift mask, it is necessary to increase the transmittance of the etching stopper film that remains between the transparent substrate and the pattern of the phase shift film. However, it is difficult to obtain sufficient transmittance by the chromium-based film. Further, a high ratio of oxygen and nitrogen contained in the chromium-based film is necessary for increasing the transmittance of the chromium-based film. However, in such a chromium-based film, side etching tends to proceed in etching, and the pattern of the phase shift film formed on the etching stopper film tends to collapse by the side etching.

Further, as another method for dealing with the above problem, in a phase shift mask blank in which an etching stopper film, a film containing silicon as a phase shift film, a light-shielding film or a chromium-based film as an etching mask film are formed on a transparent substrate from the transparent substrate side, a phase shift mask blank including a film composed of a metal-containing material as an etching stopper film, may be used. In this case, the film composed of a metal-containing material has different etching properties to dry etching using a fluorine-based gas applied for etching of a film containing silicon, and has resistance to dry etching using a chlorine-based gas applied for etching of a chromium-based film.

By this way, it is possible to prevent etching of the transparent substrate by the etching stopper film when the phase shift film is etched by a fluorine-based gas. Further, unlike the chromium-based etching stopper film, the etching stopper film exposed by etching of the phase shift film is not etched at the time when the light-shielding film or the etching mask film is etched by dry etching using a chlorine-based gas. Thus, it is possible to prevent the pattern of the phase shift film from collapsing due to side etching.

However, in this case, since the etching stopper film remains on the transparent substrate at the portion of the phase shift mask where the phase shift film is not formed, the etching stopper film is necessary to have high transmittance with respect to the exposure light. When the transmittance of the etching stopper film is low, the amount of light transmitted through the portion of the phase shift mask where the phase shift film not formed results in insufficient transmittance, for exposure using the phase shift mask, thus, improvement of contrast which is function of the phase shift mask cannot be accomplished. Further, when the transmittance of the etching stopper film is low, the etching stopper film absorbs a large amount of exposure light, and the heat derived from the absorbed exposure light causes thermal expansion of the phase shift mask. The thermal expansion deteriorates accuracy of position of the phase shift mask pattern.

The present invention has been made to solve the above problems, and an object of the present invention is to provide a phase shift mask blank in which a transparent substrate is hard to be etched when a phase shift film composed of a film containing silicon is dry etched by a fluorine-based gas, and a phase shift mask blank in which the required high transmittance is ensured in the portion where the phase shift film is not formed for a phase shift mask that has been prepared from the phase shift mask blank, further, to provide a phase shift mask blank in which collapse of the phase shift film pattern is suppressed, even when a film that can be dry-etched by a chlorine-based gas such as a chromium-based film is formed on the phase shift film, and the film is dry-etched by a chlorine-based gas. Further, another object of the present invention is to provide a manufacturing method of a phase shift mask from the phase shift mask blank, and a phase shift mask.

The inventor has found a phase shift mask blank including a phase shift film that has a thickness of 50 to 90 nm and is formed on a transparent substrate, and an etching protection film that is formed in contact with the transparent substrate side of the phase shift film, and composed of a material containing hafnium and oxygen or hafnium, silicon and oxygen, and has a thickness of 1 to 30 nm, and a transmittance of not less than 85%, with respect the exposure light. Further, the inventor has found in the phase shift mask blank that: the transparent substrate is hard to be etched when the phase shift film composed of a film containing silicon is dry etched by a fluorine-based gas; the required high transmittance is ensured in the portion where the phase shift film is not formed for a phase shift mask that has been prepared from the phase shift mask blank; and collapse of the phase shift film pattern is hard to occur, even when a film such as a chromium-based film that can be dry-etched by a chlorine-based gas is formed on the phase shift film, and the chromium-based film is dry-etched by a chlorine-based gas.

In one aspect, the invention provides a phase shift mask blank including a transparent substrate, an etching protection film formed on the transparent substrate, and a phase shift film formed in contact with the etching protection film, wherein exposure light is ArF excimer laser, the etching protection film is composed of a material containing hafnium and oxygen or hafnium, silicon and oxygen, and has a thickness of 1 to 30 nm, and a transmittance of not less than 85% with respect the exposure light, and the phase shift film is composed of a material containing silicon and being free of hafnium, and has a thickness of 50 to 90 nm.

Preferably, in the material containing hafnium and oxygen or hafnium, silicon and oxygen, an atomic ratio of silicon to the sum of hafnium and silicon is 0.1 to 99%.

Preferably, the etching protection film and the phase shift film satisfy the value of not more than 0.002 that is calculated by the following expression (1):

$$ODs \times Rep/Rps \quad (1)$$

wherein Rps and Rep represent etching rates (nm/sec) of the phase shift film and the etching protection film, respectively, in dry etching under the same condition by a fluorine-based gas, and ODs represents an optical density with respect to the exposure light per 1 nm thickness of the protection film.

Preferably, the transparent substrate is a quartz substrate.

Preferably, the etching protection film is formed in contact with the transparent substrate.

Preferably, the material containing hafnium and oxygen or hafnium, silicon and oxygen has an oxygen content of not less than 60 at %.

Preferably, an etching selectivity of the phase shift film to the etching protection film in dry etching under the same condition by a fluorine-based gas is not less than 1.5.

Preferably, the phase shift film has a phase shift of 150 to 210 degrees with respect to the exposure light.

Preferably, the phase shift mask blank further includes a third film composed of a material containing chromium, wherein an etching selectivity of the third film to the etching protection film in dry etching under the same condition by a chlorine-based gas is not less than 10.

In another aspect, the invention provides a method for manufacturing a phase shift mask using the phase shift mask blank, including the step of dry etching the phase shift film by a fluorine-based gas.

In another aspect, the invention provides a method for manufacturing a phase shift mask using the phase shift mask blank, including the steps of dry etching the phase shift film by a fluorine-based gas, and dry etching the third film by a chlorine-based gas.

In the other aspect, the invention provides a phase shift mask including a transparent substrate, an etching protection film formed on the transparent substrate, and a phase shift film pattern formed in contact with the etching protection film, wherein exposure light is ArF excimer laser, the etching protection film is composed of a material containing hafnium and oxygen or hafnium, silicon and oxygen, and has a thickness of 1 to 30 nm between the transparent substrate and the phase shift mask pattern, and a transmittance of not less than 85% with respect the exposure light, and the phase shift film pattern is composed of a material containing silicon and being free of hafnium, and has a thickness of 50 to 90 nm.

Preferably, in the material containing hafnium and oxygen or hafnium, silicon and oxygen, an atomic ratio of silicon to the sum of hafnium and silicon is 0.1 to 99%.

Preferably, the etching protection film and the phase shift film satisfy the value of not more than 0.002 that is calculated by the following expression (1):

$$ODs \times Rep/Rps \quad (1)$$

wherein Rps and Rep represent etching rates (nm/sec) of the phase shift film and the etching protection film, respectively, in dry etching under the same condition by a fluorine-based gas, and ODs represents an optical density with respect to the exposure light per 1 nm thickness of the protection film.

Preferably, the transparent substrate is a quartz substrate.

Preferably, the etching protection film is formed in contact with the transparent substrate.

Preferably, the material containing hafnium and oxygen or hafnium, silicon and oxygen has an oxygen content of not less than 60 at %.

Preferably, an etching selectivity of the phase shift film to the etching protection film in dry etching under the same condition by a fluorine-based gas is not less than 1.5.

Preferably, the phase shift film has a phase shift of 150 to 210 degrees with respect to the exposure light.

Preferably, the phase shift mask further includes a pattern of a third film composed of a material containing chromium, wherein an etching selectivity of the third film to the etching protection film in dry etching under the same condition by a chlorine-based gas is not less than 10.

Advantageous Effects of the Invention

The phase shift mask blank of the invention is easy to control the phase shift in the phase shift film since etching properties of the etching protection film are different from those of the phase shift film in dry etching using a fluorine-based gas, and in patterning of the phase shift film, the etching of the phase shift film is hard to exert an influence on the transparent substrate in the dry etching for the phase shift film, and the transparent substrate is hard to be etched. Thus, from the phase shift mask blank of the invention, it is possible to manufacture a phase shift mask in which a required high transmittance of exposure light that transmits at the portion where the phase shift film is not formed has been ensured. Further, since the etching protection film of the phase shift mask blank of the invention is resistant to dry etching using a chlorine-based gas, collapse of the phase-shift film pattern by side etching that is occurred in an etching stopper film composed of a chromium-based film can be suppressed.

BRIEF DESCRIPTION OF THE DRAWINGS

FIG. 5 is a schematic view of an etching apparatus used in Examples and Comparative example.

DESCRIPTION OF THE PREFERRED EMBODIMENTS

[First Embodiment of Phase Shift Mask Blank]

The phase shift mask blank of the invention includes a transparent substrate, an etching protection film formed on the transparent substrate, and a phase shift film formed on the etching protection film.

Figure 1:
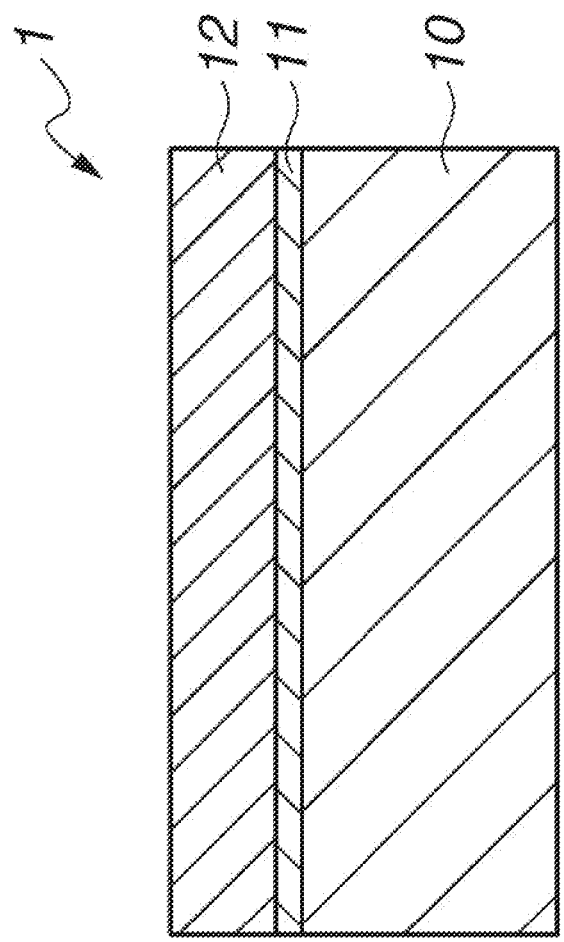
FIG. 1 is a cross-sectional view illustrating an exemplary phase shift mask blank of the first embodiment of the invention.

Concreate example of the phase shift mask blank (first embodiment) of the invention is shown in FIG. 1. FIG. 1 is a cross-sectional view illustrating an exemplary phase shift mask blank of the first embodiment of the invention. The phase shift mask blank 1 includes a transparent substrate 10, an etching protection film 11 formed on the transparent substrate 10, and a phase shift film 12 formed on the etching protection film 11.

The phase shift mask blank of the invention is suitable for exposure in which a pattern is transferred with exposure light having a wavelength of not more than 250 nm, particularly a wavelength of not more than 200 nm, such as ArF excimer laser light (wavelength 193 nm) and $F_2$ laser light (wavelength 157 nm). The phase shift mask blank is most effective for exposing by exposure light of ArF excimer laser light.

<Transparent Substrate>

The transparent substrate in the invention is preferably, for example, a 6 inch square, 0.25 inch thick transparent substrate, called 6025 substrate specified by the SEMI standard, which is often denoted by a 152 mm square, 6.35 mm thick transparent substrate, according to the SI unit system, however, the transparent substrate is not limited thereto. The transparent substrate is preferably a quartz substrate.

<Etching Protection Film and Phase Shift Film>

The etching protection film is composed of a material containing hafnium and oxygen or hafnium, silicon and oxygen. A material containing silicon and oxygen has a high transmittance to exposure light, particularly, to ArF excimer laser, however, the material, like a transparent substrate such as a quartz substrate, is easy to be etched by dry etching using a fluorine-based gas. On the other hand, the material containing hafnium and oxygen or hafnium, silicon and oxygen that constitutes the etching protection film of the invention has a high transmittance to the exposure light and is slightly etched by dry etching using a fluorine-based gas. However, the etching properties of the material differ from those of the phase shift film, therefore, the etching of the phase shift film is hard to affect to the transparent substrate. Further, the material containing hafnium and oxygen or hafnium, silicon and oxygen is resistant to dry etching using a chlorine-based gas.

The etching protection film is preferably formed in contact with the transparent substrate. The etching protection film may further contain at least one element selected from the group consisting of nitrogen and carbon, however, the etching protection film is preferably composed of a material consisting of hafnium and oxygen or hafnium, silicon and oxygen. A content of hafnium contained in the etching protection film is preferably not less than 0.5 at %, more preferably not less than 10 at %, and preferably not more than 50 at %, more preferably not more than 40 at %.

The material containing hafnium, silicon and oxygen can form the etching protection film having high flatness of its surface, therefore, the etching protection film preferably contains silicon. In this case, a ratio of silicon to the sum of hafnium and silicon is more preferably not less than 0.1 at %. On the other hand, to make significantly different properties in the etching protection film to the phase shift film in the dry etching using a fluorine-based gas, a ratio of silicon to the sum of hafnium and silicon is preferably not more than 99 at %, more preferably not more than 65 at %. Further, a ratio of oxygen contained in the etching protection film is preferably not less than 60 at %. The ratio of oxygen contained in the etching protection film is normally not more than 80 at %, however, not limited thereto. In the invention, the compositions of various films formed on the transparent substrate may be measured by, for example, XPS (X-ray photoelectric spectroscopy).

A thickness of the etching protection film is preferably not less than 1 nm, and preferably not more than 30 nm, more preferably not more than 10 nm. As described below, an etching time for dry etching of the phase shift film by a fluorine-based gas is normally set a treating time for etching including an extended time of not less than 10%, generally about 10 to 50% of the etching clear time of the phase shift film. In other words, the dry etching is performed under over-etching condition. Thus, the etching protection film is exposed to the dry etching using a fluorine-based gas for the corresponding time of over-etching. Therefore, the etching protection film preferably has a thickness that can remain the etching protection film after performing the dry etching of the phase shift film by a fluorine-based gas under the over-etching condition for a time including an extended time of not less than 10%, more preferably not less than 30%, even more preferably not less than 50%, of the etching clear time of the phase shift film. A transmittance of the etching protection film is preferably not less than 85%, more preferably not less than 90%, with respect to the exposure light, particularly, ArF excimer laser. An upper limit of the transmittance is normally less than 100%, however, not limited thereto. As this transmittance, a ratio of an amount of the exposure light transmitted through the transparent substrate and the etching protection film to an amount of the exposure light transmitted through the transparent substrate may be applied.

The phase shift film is composed of a material containing silicon and free of hafnium. The etching protection film is etched by dry etching using a fluorine-based gas, and is resistant to dry etching using a chlorine-based gas. The phase shift film is preferably formed in contact with the etching protection film. The phase shift film is preferably composed of a silicon compound which further contains at least one element selected from the group consisting of transition metals (Me) except for hafnium, preferably except for hafnium and chromium, oxygen (O), nitrogen (N) and carbon (C). Examples of the silicon compound include a transition metal silicon oxide (MeSiO), a transition metal silicon nitride (MeSiN), a transition metal silicon carbide (MeSiC), a transition metal silicon oxide nitride (MeSiON), a transition metal silicon oxide carbide (MeSiOC), a transition metal silicon nitride carbide (MeSiNC) and a transition metal silicon oxide nitride carbide (MeSiONC). Here, the chemical formula for expressing the silicon compound represents the constituent elements and does not mean the composition ratio of the constituent elements (the same applies to the following silicon compounds). The transition metal (Me) is preferably at least one element selected from the group consisting of molybdenum (Mo), tantalum (Ta), and zirconium (Zr), and molybdenum is most preferable.

The phase shift film has a thickness of preferably not less than 50 nm, more preferably not less than 60 nm, and preferably not more than 90 nm, more preferably not more than 80 nm. The phase shift film has a phase shift of preferably not less than 150 degrees, more preferably not less than 165 degrees, even more preferably not less than 175 degrees, and preferably not more than 210 degrees, more preferably not more than 195 degrees, even more preferably not more than 185 degrees, and most preferably approximately 180 degrees. Here, the phase shift is a difference of phases that occurs between an exposure light that has passed through the phase shift film and an exposure light that has passed through the air by the same distance as the thickness of the phase shift film. Further, the phase shift film has a transmittance of preferably not less than 5%, more preferably not less than 9%, and preferably not more than 40%, more preferably not more than 30%, with respect to the exposure light. The phase shift film, the phase shift mask blank and the phase shift mask of the invention may be a halftone phase shift film, a halftone phase shift mask blank and a halftone phase shift mask, respectively.

In the dry etching using a fluorine-based gas of the phase shift film, it is required that an etching rate (Rep) of the etching protection film should be sufficiently lower than an etching rate (Rps) of the phase shift film to prevent etching into the transparent substrate. On the other hand, when the etching protection film is resistant to the subsequent etching (for example, dry etching for a third film by a chlorine-based gas), after the etching of the phase shift film, since the etching protection film remains on the transparent substrate at a portion where the pattern of the phase shift film is not formed, i.e., at a portion where the etching protection film is exposed, it is required that the etching protection film has a high transmittance with respect to exposure light.

When a pattern of the phase shift film is formed by dry etching using a fluorine-based gas to the phase shift film, a treating time for etching is normally set a time including an extended time of about 10 to 50% of the etching clear time of the phase shift film. In other words, the dry etching is performed under over-etching condition. This is to prevent the phase shift film from remaining in a portion where the pattern of the phase shift film should not be formed. On the other hand, when the phase shift film is formed directly on the transparent substrate, the transparent substrate is etched by the over-etching, and the resulting phase shift has a difference to the set value for the phase shift film. In the invention, the etching protection film that has different etching properties to the phase shift film in dry etching using a fluorine-based gas is provided between the phase shift film and the transparent substrate to avoid this problem. However, in over-etching of the phase shift film, when the etching protection film is etched by dry etching using a fluorine-based gas, differences in the etching amount may occur in the plane of the etching protection film caused by the in-plane distribution of the dry etching. Particularly, in some cases, when an optical density per unit film thickness of the etching protection film is large, uniformity of transmittance in-plane of the etching protection film may deteriorate due to in-plane differences in the etching amount of the etching protection film.

In the phase shift mask blank of the invention, to ensure a sufficiently high transmittance of the etching protection film, with respect to the exposure light, and to prevent deterioration of uniformity of transmittance in-plane of the etching protection film due to over-etching of the phase shift film in dry etching using a fluorine-based gas to the phase shift film, for example, to prevent deterioration of uniformity of transmittance in-plane of the etching protection film, which is caused by variation in etching amounts of the etching protection film due to an etching device, difference in etching amounts between the etching protection film at the center of substrate and the etching protection film at the corners of the substrate, or difference in etching amounts of the etching protection film caused by loading effect, it is effective that the etching protection film and the phase shift film preferably satisfy the value of not more than 0.002 that is calculated by the following expression (1):

$$ODs \times Rep/Rps \qquad (1)$$

wherein Rps and Rep represent etching rates (nm/sec) of the phase shift film and the etching protection film, respectively, in dry etching under the same condition by a fluorine-based gas, and ODs represents an optical density with respect to the exposure light per 1 nm thickness of the protection film. The value calculated by the above expression (1) corresponds to an optical density that is reduced in the etching protection film by etching while the etching protection film is etched for a time for which the phase shift film is etched by a thickness of 1 nm. When the value calculated by the above expression (1) is small, uniform of distribution of the transmittance in the plane of the etching protection film can be obtained. The value calculated by the above expression (1) is preferably less than 0.002, more preferably not more than 0.0015.

With respect to the etching protection film and the phase shift film, in the viewpoint of ensuring etching resistance of the etching protection film when the phase shift film is over-etched, an etching selectivity of the phase shift film to the etching protection film in dry etching under the same condition by a fluorine-based gas is preferably not less than 1.5, more preferably not less than 5, even more preferably not less than 10. An upper limit of the etching selectivity is normally not more than 30, however, not limited thereto. The etching selectivity is a ratio of an etching rate of the phase shift film to an etching rate of the etching protection film.

<Film-Forming Method for Etching Protection Film and Phase Shift Film>

The etching protection film and the phase shift film in the invention can be formed by applying a film-forming method commonly known in manufacturing of a phase shift mask blank. However, they are formed by preferable a sputtering method in which a film having excellent homogeneity can be easily obtained. Either DC sputtering or RF sputtering can be used, however, magnetron sputtering is more preferable. A target and a sputter gas are appropriately selected according to layer structure and composition.

The etching protection film may be formed by using a hafnium target or a target composed of hafnium and silicon, or by co-sputtering which uses a hafnium target and a silicon target and discharges the targets at the same time, or by co-sputtering which uses a hafnium target and/or a silicon target, and a target composed of hafnium and silicon and discharges the targets at the same time.

When the phase shift film contains silicon and does not contain a transition metal, a silicon target may be used. When a silicon-containing film containing a transition metal is formed, the phase shift film may be formed by using a target composed of a transition metal and silicon, or by co-sputtering which uses a transition metal target and a silicon target and discharges the targets at the same time, or by co-sputtering which uses a transition metal target and/or a silicon target, and a target composed of a transition metal and silicon and discharges the targets at the same time. Further, the target may contain nitrogen, and a target containing nitrogen and a target free of nitrogen may be used at the same time.

Contents of oxygen, nitrogen and carbon in the etching protection film and the phase shift film are controlled by reactive sputtering using a reactive gas as a sputtering gas with adjusting appropriately an amount of the reactive gas, which is introduced into a sputter chamber, such as an oxygen-containing gas such as oxygen gas, a nitrogen-containing gas such as nitrogen gas, an oxygen nitrogen-containing gas such as nitrous oxide gas, nitrogen monoxide gas and nitrogen dioxide gas, and a carbon-containing gas such as carbon monoxide gas, carbon dioxide gas and a hydrocarbon gas such methane gas. Further, a rare gas such as helium gas, neon gas, argon gas, krypton gas and xenon gas can be also used as the sputter gas.

[Other Embodiments of Phase Shift Mask Blank]

Figure 2:
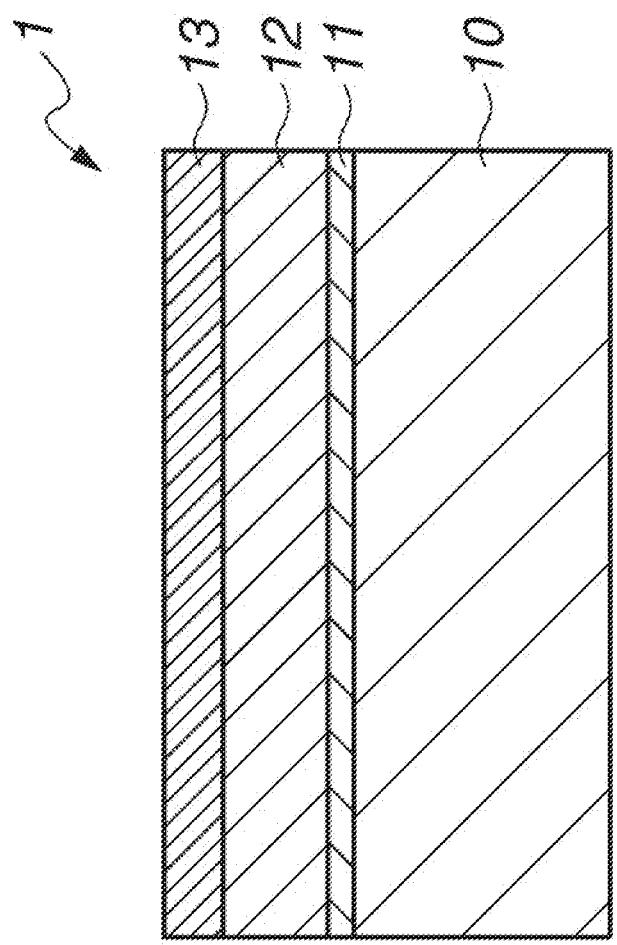
FIG. 2 is a cross-sectional view illustrating an exemplary phase shift mask blank of the second embodiment of the invention.

In the phase shift mask blank of the invention, from the phase shift film side, a third film, a fourth film and a fifth film may be formed on the phase shift film. A concreate example of the phase shift mask blank (second embodiment) in which a third film is formed on the phase shift film is shown in FIG. 2. FIG. 2 is a cross-sectional view illustrating an exemplary phase shift mask blank of the second embodiment of the invention. The phase shift mask blank 1 includes a transparent substrate 10, an etching protection film 11 formed on the transparent substrate 10, a phase shift film 12 formed on the etching protection film 11, and a third film 13 formed on the phase shift film 12.

Figure 3:
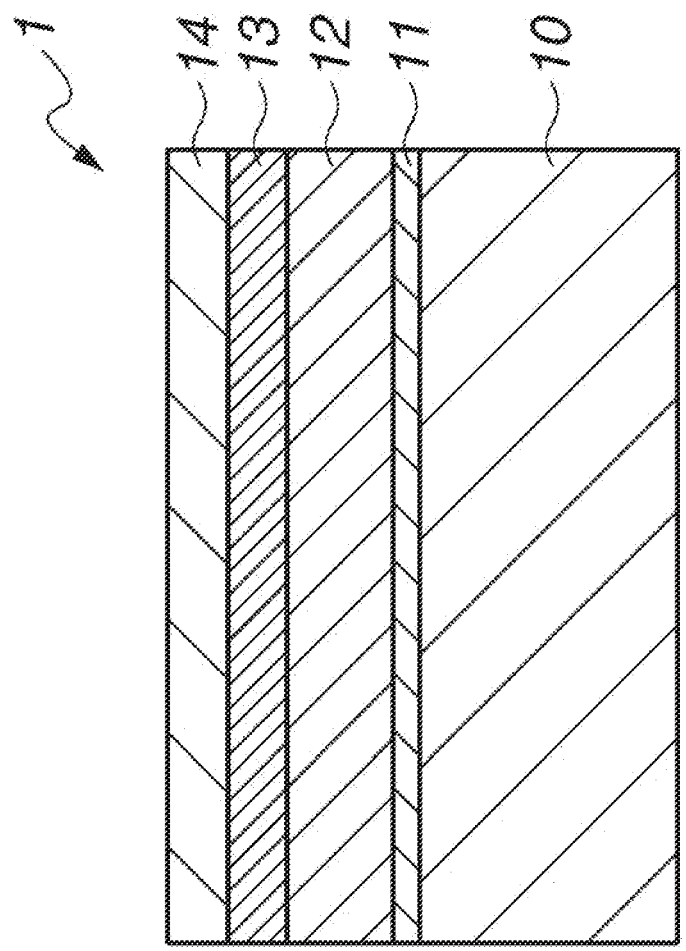
FIG. 3 is a cross-sectional view illustrating an exemplary phase shift mask blank of the third embodiment of the invention.

Further, a concreate example of the phase shift mask blank (third embodiment) in which a third film and a fourth film are formed on the phase shift film is shown in FIG. 3. FIG. 3 is a cross-sectional view illustrating an exemplary phase shift mask blank of the third embodiment of the invention. The phase shift mask blank 1 includes a transparent substrate 10, an etching protection film 11 formed on the transparent substrate 10, a phase shift film 12 formed on the etching protection film 11, a third film 13 formed on the phase shift film 12, and a fourth film 14 formed on the third film 13.

Figure 4:
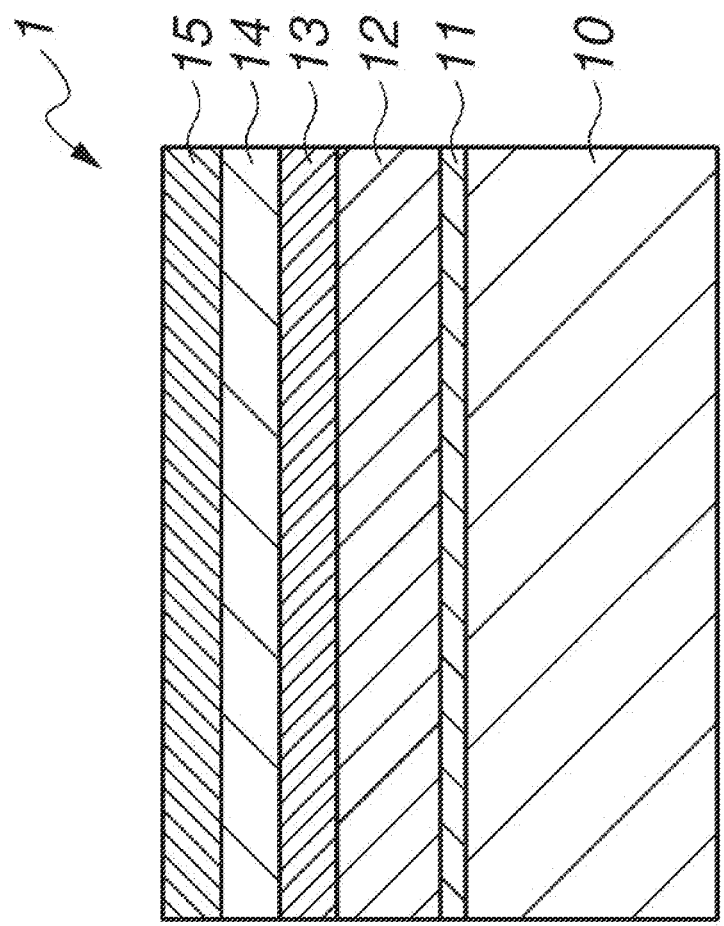
FIG. 4 is a cross-sectional view illustrating an exemplary phase shift mask blank of the fourth embodiment of the invention.

Further, a concreate example of the phase shift mask blank (fourth embodiment) in which a third film, a fourth film and a fifth film are formed on the phase shift film is shown in FIG. 4. FIG. 4 is a cross-sectional view illustrating an exemplary phase shift mask blank of the fourth embodiment of the invention. The phase shift mask blank 1 includes a transparent substrate 10, an etching protection film 11 formed on the transparent substrate 10, a phase shift film 12 formed on the etching protection film 11, a third film 13 formed on the phase shift film 12, a fourth film 14 formed on the third film 13, and a fifth film 15 formed on the fourth film 14.

<Third Film>

A third film consisting of a single layer or multiple layers may be formed on the phase shift film of the phase shift mask blank of the invention. The third film is normally in contact with the phase shift film. Examples of the third film include a light-shielding film, a combination of a light-shielding film and an antireflection film, a processing aid film (an etching mask film) that functions as a hard mask in forming a pattern of the phase shift film. Further, when the fourth film is provided, the third film may be utilized also as a processing aid film (an etching stopper film) that functions as an etching stopper in forming a pattern of the fourth film. The third film is preferably composed of a material containing chromium.

The etching protection film of the invention is hard to be etched by dry etching using a chlorine-based gas (for example, a chlorine gas containing oxygen, specifically, a mixed gas of chlorine gas ($Cl_2$) and oxygen gas ($O_2$) (hereafter, the same applies to an example for the chlorine-based gas). Therefore, a portion where the phase shift film is removed and the pattern of the phase shift film is not formed, i.e., a portion where the etching protection film has been exposed has resistance to the subsequent dry etching using a chlorine-based for the third film.

With respect to the etching protection film and the third film (typically, a light-shielding film or a combination of a light-shielding film and an antireflection film), in the viewpoint of ensuring etching resistance of the etching protection film when the third film is etched, an etching selectivity of the third film to the etching protection film in dry etching under the same condition by a chlorine-based gas is preferably not less than 10, more preferably not less than 15, even more preferably not less than 20. An upper limit of the etching selectivity is normally not more than 30, however, not limited thereto. The etching selectivity is a ratio of an etching rate of the third film to an etching rate of the etching protection film.

(Light-Shielding Film and Antireflection Film as Third Film)

By forming the third film including a light-shielding film, a region that completely shields exposure light can be formed in the phase shift mask. The third film including a light-shielding film may be utilized also for a processing aid film in etching Many examples (for example, disclosed in JP-A 2007-33469 (Patent Document 2) and JP-A 2007-233179 (Patent Document 3)) regarding a film configuration and materials of the light-shielding film and the antireflection film are disclosed. As a film configuration of a preferable combination of the light-shielding film and the antireflection film, for example, a light-shielding film composed a material containing chromium is provided, and an antireflection film composed of a material containing chromium that reduces reflection from the light-shielding film is further provided. Each the light-shielding film and the antireflection film may consist of a single layer or multiple layers.

Examples of a material containing chromium for the light-shielding film or the antireflection film include chromium simple substance, and a chromium compound such as chromium oxide (CrO), chromium nitride (CrN), chromium carbide (CrC), chromium oxide nitride (CrON), chromium oxide carbide (CrOC), chromium nitride carbide (CrNC), and chromium oxide nitride carbide (CrONC). Here, the chemical formula for expressing the chromium compound represents the constituent elements and does not mean the composition ratio of the constituent elements (the same applies to the following chromium compounds).

In the case that the third film is the light-shielding film or the combination of the light-shielding film and the antireflection film, the light-shielding film has a chromium content preferably not less than 40 at %, more preferably not less than 60 at %, and preferably less than 100 at %, more preferably not more than 99 at %, even more preferably not more than 90 at %. An oxygen content in the light-shielding film is preferably not more than 60 at %, more preferably not more than 40 at %, and even more preferably not less than 1 at %. A nitrogen content in the light-shielding film is preferably not more than 50 at %, more preferably not more than 40 at %, and even more preferably not less than 1 at %. A carbon content in the light-shielding film is preferably not more than 20 at %, more preferably not more than 10 at %, and in case that adjustment of etching rate is needed, even more preferably not less than 1 at %. In this case, a total content of chromium, oxygen, nitrogen and carbon is preferably not less than 95 at %, more preferably not less than 99 at %, even more preferably 100 at %.

Further, in the case that the third film is the combination of the light-shielding film and the antireflection film, the antireflection film is preferably composed of chromium compound, and has a chromium content preferably not less than 30 at %, more preferably not less than 35 at %, and preferably not more than 70 at %, more preferably not more than 50 at %. An oxygen content in the antireflection film is preferably not more than 60 at %, and even more preferably not less than 1 at %, particularly not less than 20 at %. A nitrogen content in the antireflection film is preferably not more than 50 at %, more preferably not more than 30 at %, and even more preferably not less than 1 at %, particularly not less than 3 at %. A carbon content in the antireflection film is preferably not more than 20 at %, more preferably not more than 5 at %, and in case that adjustment of etching rate is needed, even more preferably not less than 1 at %. In this case, a total content of chromium, oxygen, nitrogen and carbon is preferably not less than 95 at %, more preferably not less than 99 at %, even more preferably 100 at %.

In the case that the third film is the light-shielding film or the combination of the light-shielding film and the antireflection film, the third film has a thickness of preferably not less than 20 nm, more preferably not less than 40 nm, and preferably not more than 100 nm, more preferably not more than 70 nm. A total optical density of the phase shift film and the third film is preferably not less than 2, more preferably not less than 2.5, even more preferably 3, with respect to exposure light having a wavelength of not more than 200 nm, particularly ArF excimer laser (wavelength of 193 nm).

(Processing Aid Film as Third Film)

In case that the third film is the processing aid film, the third film may be utilized as a processing aid film (an etching mask film) that functions as a hard mask in forming a pattern of the phase shift film, and may be utilized also as a processing aid film (an etching stoper film) that functions as an etching stopper in forming a pattern of the fourth film.

As examples of the processing aid film, films composed of a material containing chromium which is disclosed in JP-A 2007-241065 (Patent Document 4) are exemplified. The processing aid film may consist of a single layer or multiple layers.

Examples of a material containing chromium for the processing aid film include chromium simple substance, and a chromium compound such as chromium oxide (CrO), chromium nitride (CrN), chromium carbide (CrC), chromium oxide nitride (CrON), chromium oxide carbide (CrOC), chromium nitride carbide (CrNC), and chromium oxide nitride carbide (CrONC).

In the case that the third film is the processing aid film, the chromium compound of the third film has a chromium content preferably not less than 40 at %, more preferably not less than 50 at %, and preferably less than 100 at %, more preferably not more than 99 at %, even more preferably not more than 90 at %. An oxygen content in the processing aid film is preferably not more than 60 at %, more preferably not more than 55 at %, and in case that adjustment of etching rate is needed, even more preferably not less than 1 at %. A nitrogen content in the processing aid film is preferably not more than 50 at %, more preferably not more than 40 at %, and even more preferably not less than 1 at %. A carbon content in the processing aid film is preferably not more than 20 at %, more preferably not more than 10 at %, and in case that adjustment of etching rate is needed, even more preferably not less than 1 at %. In this case, a total content of chromium, oxygen, nitrogen and carbon is preferably not less than 95 at %, more preferably not less than 99 at %, even more preferably 100 at %.

In the case that the third film is the processing aid film, the third film has a thickness of preferably not less than 2 nm, more preferably not less than 5 nm, and preferably not more than 20 nm, more preferably not more than 15 nm.

<Fourth Film>

A fourth film consisting of a single layer or multiple layers may be formed on the third film of the phase shift mask blank of the invention. The fourth film is normally in contact with the third film. Examples of the fourth film include a processing aid film, a light-shielding film, a combination of a light-shielding film and an antireflection film. The fourth film is preferably composed of a material containing silicon, in particular, composed of a material free of chromium.

(Processing Aid Film as Fourth Film)

In the case that the third film is the light-shielding film or the combination of the light-shielding film and the antireflection film, or third film is the processing aid film that functions as a hard mask in forming a pattern of the phase shift film, as the fourth film, a processing aid film (an etching mask film) that functions as a hard mask in forming a pattern of the third film may be formed. Further, in case that a fifth film is provided, the fourth film may be utilized also for a processing aid film (an etching stopper film) that functions as an etching stopper in forming a pattern of the fifth film.

The processing aid film is preferably composed of a material that has different etching properties to the third film, for example, a material that is resistant to dry etching using a chlorine-based gas (particularly, a chlorine gas containing oxygen) applied to etching for a material containing chromium, in particular, a material containing silicon that is susceptible to dry etching using a fluorine-based gas such as $SF_6$ and $CF_4$.

Examples of a material containing silicon include silicon simple substance, and a silicon compound such as a material containing silicon and either or both of nitrogen and oxygen, a material containing silicon and a transition metal, and a material containing silicon, either or both of nitrogen and oxygen, and a transition metal. Examples of the transition metal include molybdenum, tantalum and zirconium.

In the case that the fourth film is the processing aid film, the processing aid film is preferably composed of a silicon compound. A silicon content in the silicon compound is preferably not less than 20 at %, more preferably not less than 33 at %, and preferably not more than 95 at %, more preferably not more than 80 at %. A nitrogen content in the processing aid film is preferably not more than 50 at %, more preferably not more than 30 at %, and even more preferably not less than 1 at %. An oxygen content in the processing aid film is preferably not more than 70 at %, more preferably not more than 66 at %, and in case that adjustment of etching rate is needed, even more preferably not less than 1 at %, and further preferably not less than 20 at %. The silicon compound may contain a transition metal or not. When the silicon compound contains a transition metal, a content of the transition metal in the processing aid film is preferably not more than 35 at %, more preferably not more than 20 at %. In this case, a total content of silicon, oxygen, nitrogen and the transition metal is preferably not less than 95 at %, more preferably not less than 99 at %, even more preferably 100 at %.

In the case that the third film is the light-shielding film or the combination of the light-shielding film and the antireflection film, and fourth film is the processing aid film, the third film has a thickness of preferably not less than 20 nm, more preferably not less than 40 nm, and preferably not more than 100 nm, more preferably not more than 70 nm, and the fourth film has a thickness of preferably not less than 1 nm, more preferably not less than 2 nm, and preferably not more than 30 nm, more preferably not more than 15 nm. Further, a total optical density of the phase shift film, the third film and the fourth film is preferably not less than 2, more preferably not less than 2.5, even more preferably 3, with respect to exposure light having a wavelength of not more than 200 nm, particularly ArF excimer laser (wavelength of 193 nm).

On the other hand, in the case that the third film is the processing aid film, and fourth film is the processing aid film, the third film has a thickness of preferably not less than 1 nm, more preferably not less than 2 nm, and preferably not more than 20 nm, more preferably not more than 10 nm, and the fourth film has a thickness of preferably not less than 1 nm, more preferably not less than 2 nm, and preferably not more than 20 nm, more preferably not more than 10 nm.

(Light-Shielding Film and Antireflection Film as Fourth Film)

In the case that the third film is the processing aid film, as the fourth film, a light-shielding film may be formed. Further as the fourth film, a combination of a light-shielding film and an antireflection film may be formed.

The light-shielding film and the antireflection film as the fourth film is preferably composed of a material that has different etching properties to the third film, for example, a material that is resistant to dry etching using a chlorine-based gas (particularly, a chlorine gas containing oxygen) applied to etching for a material containing chromium, in particular, a material containing silicon that is susceptible to dry etching by a fluorine-based gas such as $SF_6$ and $CF_4$.

Examples of a material containing silicon include silicon simple substance, and a silicon compound such as a material containing silicon and either or both of nitrogen and oxygen, a material containing silicon and a transition metal, and a material containing silicon, either or both of nitrogen and oxygen, and a transition metal. Examples of the transition metal include molybdenum, tantalum and zirconium.

In the case that the fourth film is the light-shielding film or the combination of the light-shielding film and the antireflection film, the light-shielding film and the antireflection film are preferably composed of a silicon compound. A silicon content in the silicon compound is preferably not less than 10 at %, more preferably not less than 30 at %, and preferably less than 100 at %, more preferably not more than 95 at %. A nitrogen content in the light-shielding film or the antireflection film is preferably not more than 50 at %, more preferably not more than 40 at %, even more preferably not more than 20 at %, and in case that adjustment of etching rate is needed, even more preferably not less than 1 at %. An oxygen content in the light-shielding film or the antireflection film is preferably not more than 60 at %, more preferably not more than 30 at %, and in case that adjustment of etching rate is needed, preferably not less than 1 at %. A transition metal content in the light-shielding film or the antireflection film is preferably not more than 35 at %, more preferably not more than 20 at %, and even more preferably not less than 1 at %. In this case, a total content of silicon, oxygen, nitrogen and the transition metal is preferably not less than 95 at %, more preferably not less than 99 at %, even more preferably 100 at %.

In the case that the third film is the processing aid film, and the fourth film is the combination of the light-shielding film and the antireflection film, the third film has a thickness of preferably not less than 1 nm, more preferably not less than 2 nm, and preferably not more than 20 nm, more preferably not more than 10 nm, and the fourth film has a thickness of preferably not less than 20 nm, more preferably not less than 30 nm, and preferably not more than 100 nm, more preferably not more than 70 nm. Further, a total optical density of the phase shift film, the third film and the fourth film is preferably not less than 2, more preferably not less than 2.5, even more preferably 3, with respect to exposure light having a wavelength of not more than 200 nm, particularly ArF excimer laser (wavelength of 193 nm).

<Fifth Film>

A Fifth film consisting of a single layer or multiple layers may be formed on the fourth film of the phase shift mask blank of the invention. The fifth film is normally in contact with the fourth film. Examples of the fifth film include a processing aid film that functions as a hard mask in forming a pattern of the fourth film. The fifth film is preferably composed of a material containing chromium.

(Processing Aid Film as Fifth Film)

In the case that the fourth film is the light-shielding film or the combination of the light-shielding film and the antireflection film, as the fifth film, a processing aid film (an etching mask film) that functions as a hard mask in forming a pattern of the fourth film may be formed.

The processing aid film is preferably composed of a material that has different etching properties to the fourth film, for example, a material that is resistant to dry etching using a fluorine-based gas applied to etching for a material containing silicon, in particular, a material containing chromium that is susceptible to dry etching by a chlorine-based gas (particularly, a chlorine gas containing oxygen).

Examples of a material containing chromium include chromium simple substance, and a chromium compound such as chromium oxide (CrO), chromium nitride (CrN), chromium carbide (CrC), chromium oxide nitride (CrON), chromium oxide carbide (CrOC), chromium nitride carbide (CrNC), and chromium oxide nitride carbide (CrONC).

In the case that the fifth film is the processing aid film, the chromium compound of the fifth film has a chromium content preferably not less than 30 at %, more preferably not less than 40 at %, and preferably less than 100 at %, more preferably not more than 99 at %, even more preferably not more than 90 at %. An oxygen content in the processing aid film is preferably not more than 60 at %, more preferably not more than 40 at %, and in case that adjustment of etching rate is needed, even more preferably not less than 1 at %. A nitrogen content in the processing aid film is preferably not more than 50 at %, more preferably not more than 40 at %, and in case that adjustment of etching rate is needed, even more preferably not less than 1 at %. A carbon content in the processing aid film is preferably not more than 20 at %, more preferably not more than 10 at %, and in case that adjustment of etching rate is needed, even more preferably not less than 1 at %. In this case, a total content of chromium, oxygen, nitrogen and carbon is preferably not less than 95 at %, more preferably not less than 99 at %, even more preferably 100 at %.

In the case that the third film is the processing aid film, the fourth film is the light-shielding film or the combination of the light-shielding film and the antireflection film, and the fifth film is the processing aid film, the third film has a thickness of preferably not less than 1 nm, more preferably not less than 2 nm, and preferably not more than 20 nm, more preferably not more than 10 nm, the fourth film has a thickness of preferably not less than 20 nm, more preferably not less than 30 nm, and preferably not more than 100 nm, more preferably not more than 70 nm, and the fifth film has a thickness of preferably not less than 1 nm, more preferably not less than 2 nm, and preferably not more than 30 nm, more preferably not more than 20 nm. Further, a total optical density of the phase shift film, the third film, the fourth film and the fifth film is preferably not less than 2, more preferably not less than 2.5, even more preferably 3, with respect to exposure light having a wavelength of not more than 200 nm, particularly ArF excimer laser (wavelength of 193 nm).

<Film Forming Method for Third to Fifth Films>

The film composed of the chromium-containing material for the third film and the fifth film may be formed by reactive sputtering using a target such as chromium target, or a target containing chromium added with one or more elements selected from the group consisting of oxygen, nitrogen and carbon, and using a sputtering gas containing a rare gas such as helium gas, neon gas, argon gas, krypton gas and xenon gas, and a reactive gas selected from the group consisting of an oxygen-containing gas, a nitrogen-containing gas and a carbon containing gas properly added in accordance with a composition of the film to be formed.

On the other hand, the film composed of the silicon-containing material for the fourth film may be formed by reactive sputtering using a target such as a silicon target, a silicon nitride target, a target containing both of silicon and silicon nitride, a transition metal target, and a composite target of silicon and transition metal, and using a sputtering gas containing a rare gas such as helium gas, neon gas, argon gas, krypton gas and xenon gas, and a reactive gas selected from the group consisting of an oxygen-containing gas, a nitrogen-containing gas and a carbon containing gas properly added in accordance with a composition of the film to be formed.

<Manufacturing Method of Phase Shift Mask>

From the phase shift mask blank, a phase shift mask can be manufactured by a common method. The phase shift mask of the invention can be manufactured from the phase shift mask blank by a method including a step of dry etching for the phase shift film by a fluorine-based gas. Particularly, from the phase shift mask blank of the third, fourth or fifth embodiment that includes the third film, the phase shift mask of the invention can be manufactured by a method including a step of dry etching for the phase shift film by a fluorine-based gas, and a step of dry etching for the third film by a chlorine-based gas. The followings are concrete methods for manufacturing the phase shift mask.

Concrete Example 1

As a method for manufacturing a phase shift mask from the phase shift mask blank of the first embodiment in which the etching protection film and the phase shift film are formed on the transparent substrate in this order, for example, the phase shift mask can be manufactured by the following steps.

First, an electron beam resist film is formed on the phase shift film of the phase shift mask blank, a pattern is drawn by electron beam, followed by a predetermined operation of development, to obtain a resist pattern. Next, the obtained resist pattern is used as an etching mask, and the resist pattern is transferred to the phase shift film by dry etching using a fluorine-based gas, to obtain a phase shift mask pattern. As a result, a phase shift mask is obtained. At this time, the transparent substrate is not etched by the dry etching using a fluorine-based gas since the etching protection film is present.

Concrete Example 2

As a method for manufacturing a phase shift mask from the phase shift mask blank of the second embodiment in which the etching protection film, the phase shift film, and the third film being a film composed of a material containing chromium are formed on the transparent substrate in this order, for example, the phase shift mask can be manufactured by the following steps.

First, an electron beam resist film is formed on the third film of the phase shift mask blank, a pattern is drawn by electron beam, followed by a predetermined operation of development, to obtain a resist pattern. Next, the obtained resist pattern is used as an etching mask, and the resist pattern is transferred to the third film by dry etching using a chlorin-based gas, to obtain a pattern of the third film. Next, the obtained pattern of the third film is used as an etching mask, and the pattern of the third film is transferred to the phase shift film by dry etching using a fluorine-based gas, to obtain a phase shift mask pattern. At this time, the transparent substrate is not etched by the dry etching using a fluorine-based gas since the etching protection film is present. Next, the third film is removed by dry etching using a chlorin-based gas. As a result, a phase shift mask is obtained. At this time, the etching protection film which is exposed at the portion where the phase shift film is not present is not etched by the dry etching using a chlorine-based gas. In a case that a part of the third film is necessary to be remained, after forming a resist pattern to protect the part on the third film, the third film at a part which is not protected with the resist pattern is removed by dry etching using a chlorine-based gas. Then, the resist pattern is removed by a usual method to obtain the phase shift mask.

Concrete Example 3

As a method for manufacturing a phase shift mask from the phase shift mask blank of the third embodiment in which the etching protection film, the phase shift film, the third film being the light-shielding film composed of a material containing chromium or the combination of the light-shielding film and the antireflection film composed of a material containing chromium, and the fourth film being a processing aid film composed of a material containing silicon are formed on the transparent substrate in this order, for example, the phase shift mask can be manufactured by the following steps.

First, an electron beam resist film is formed on the fourth film of the phase shift mask blank, a pattern is drawn by electron beam, followed by a predetermined operation of development, to obtain a resist pattern. Next, the obtained resist pattern is used as an etching mask, and the resist pattern is transferred to the fourth film by dry etching using a fluorine-based gas, to obtain a pattern of the fourth film. Next, the obtained pattern of the fourth film is used as an etching mask, and the pattern of the fourth film is transferred to the third film by dry etching using a chlorin-based gas, to obtain a pattern of the third film. Next, after removing the resist pattern, the obtained pattern of the third film is used as an etching mask, and the pattern of the third film is transferred to the phase shift film by dry etching using a fluorine-based gas, simultaneously removing the pattern of the fourth film. At this time, the transparent substrate is not etched by the dry etching using a fluorine-based gas since the etching protection film is present. Next, after forming a resist pattern to protect a portion at which the third film will be remained on the third film, the third film at a portion which is not protected with the resist pattern is removed by dry etching using a chlorine-based gas. Then, the resist pattern is removed by a usual method to obtain the phase shift mask.

Concrete Example 4

As another method for manufacturing a phase shift mask from the phase shift mask blank of the third embodiment in which the etching protection film, the phase shift film, the third film being the processing aid film composed of a material containing chromium, and the fourth film being the light-shielding film composed of a material containing silicon or the combination of the light-shielding film and the antireflection film composed of a material containing silicon are formed on the transparent substrate in this order, for example, the phase shift mask can be manufactured by the following steps.

First, an electron beam resist film is formed on the fourth film of the phase shift mask blank, a pattern is drawn by electron beam, followed by a predetermined operation of development, to obtain a resist pattern. Next, the obtained resist pattern is used as an etching mask, and the resist pattern is transferred to the fourth film by dry etching using a fluorine-based gas, to obtain a pattern of the fourth film. Next, the obtained pattern of the fourth film is used as an etching mask, and the pattern of the fourth film is transferred to the third film by dry etching using a chlorine-based gas, to obtain a pattern of the third film in which a portion of the third film has been removed at a portion where the phase shift film will be removed. Next, after removing the resist pattern, a resist pattern to protect a part at which the fourth film will be remained is formed on the fourth film, the obtained pattern of the third film is used as an etching mask, and the pattern of the third film is transferred to the phase shift film by dry etching using a fluorine-based gas, to obtain a pattern of the phase shift film, simultaneously removing the portion of the pattern of the fourth film not protected with the resist pattern. At this time, the transparent substrate is not etched by the dry etching using a fluorine-based gas since the etching protection film is present. Next, the resist pattern is removed by a usual method. Then, the third film is removed at the portion where the fourth film has been removed by dry etching using a chlorine-based gas, to obtain the phase shift mask. At this time, the etching protection film which is exposed at the portion where the phase shift film is not present is not etched by the dry etching using a chlorine-based gas.

Concrete Example 5

As a method for manufacturing a phase shift mask from the phase shift mask blank of the fourth embodiment in which the etching protection film, the phase shift film, the third film being the processing aid film composed of a material containing chromium, the fourth film being the light-shielding film composed of a material containing silicon or the combination of the light-shielding film and the antireflection film composed of a material containing silicon, and the fifth film being the processing aid film composed of a material containing chromium are formed on the transparent substrate in this order, for example, the phase shift mask can be manufactured by the following steps.

First, an electron beam resist film is formed on the fifth film of the phase shift mask blank, a pattern is drawn by electron beam, followed by a predetermined operation of development, to obtain a resist pattern. Next, the obtained resist pattern is used as an etching mask, and the resist pattern is transferred to the fifth film by dry etching using a chlorine-based gas, to obtain a pattern of the fifth film. Next, the obtained pattern of the fifth film is used as an etching mask, and the pattern of the fifth film is transferred to the fourth film by dry etching using a fluorine-based gas, to obtain a pattern of the fourth film. Next, after removing the resist pattern, a resist pattern to protect a part at which the fourth film will be remained is formed on the fifth film, the obtained pattern of the fourth film is used as an etching mask, and the pattern of the fourth film is transferred to the third film by dry etching using a chlorine-based gas, to obtain a pattern of the third film, simultaneously removing the portion of the fifth film not protected with the resist pattern. Next, the pattern of the third film is used as an etching mask, and the pattern of the third film is transferred to the phase shift film by dry etching using a fluorine-based gas, to obtain a pattern of the phase shift film, simultaneously removing the portion of the pattern of the fourth film not protected with the resist pattern. Next, the resist pattern is removed by a usual method. Then, the third film is removed at the portion where the fourth film has been removed, and the fifth film is removed at the portion where the resist pattern has been removed, by dry etching using a chlorine-based gas, to obtain the phase shift mask. At this time, the etching protection film which is exposed at the portion where the phase shift film is not present is not etched by the dry etching using a chlorine-based gas.

<Phase Shift Mask>

A phase shift mask includes a mask pattern (photomask pattern) on a transparent substrate. The phase shift mask of the invention includes a transparent substrate, an etching protection film formed on the transparent substrate, preferably in contact with the transparent substrate, and a phase shift film pattern formed in contact with the etching protection film. The phase shift mask may include a pattern of the third film (in particular, a light-shielding film or a combination of a light-shielding film and an antireflection film), and may further include a pattern of the fourth film, or patterns of the fourth film and the fifth film.

The transparent substrate, the etching protection film, the phase shift film, the third film, the fourth film and the fifth film may be the same as those in the phase shift mask blank. In the phase shift mask, the portion of the etching protection film at which the phase shift film is not present (i.e., the portion other than the phase shift pattern) is exposed to dry etching in manufacturing of the phase shift mask from the phase shift mask blank. Therefore, the etching protection film in the phase shift mask is, for example, about 10 to 50% thinner than the etching protection film in the phase shift mask blank. The etching protection film may not be present at the portion where the phase shift film is not present, however, it is preferable that the etching protection film is also formed (remains) at the portion where the phase shift film is not present.

The phase shift mask of the invention is particularly effective in photolithography for forming a pattern with a half pitch of not more than 50 nm, preferably not more than 30 nm, more preferably not more than 20 nm on a substrate to be processed, when a mask pattern is transferred to a photoresist film formed on the substrate to be processed by using exposure light having a wavelength of not more than 250 nm, preferably not more than 200 nm such as ArF excimer laser light (wavelength of 193 nm) and $F_2$ laser light (wavelength of 157 nm), especially by using exposure light of ArF excimer laser light.

EXAMPLES

Examples of the invention are given below by way of illustration and not by way of limitation.

Example 1

A 152 mm square, 6.35 mm thick 6025 quartz substrate was placed in a chamber of a sputtering apparatus, an etching protection film composed of HfO having a thickness of 2.0 nm was formed on the quartz substrate by using a Hf target as a sputtering target, and argon gas and oxygen gas as sputtering gases. With respect to light having a wavelength of 193 nm, a transmittance (a ratio of an amount of exposure light transmitted through the transparent substrate and the etching protection film to an amount of the exposure light transmitted through the transparent substrate) was measured in the state in which the etching protective film is formed on the quartz substrate. As a result, the transmittance was 95.3% (corresponding to an optical density of 0.021). On the other hand, an optical density (ODs) with respect to the exposure light per 1 nm thickness of the protection film itself was 0.0105. Further, a composition of the etching protection film was measured by XPS. As a result, the Hf content was 36.2 at %, and the O content was 63.8 at %. In this case, the ratio of Si to the sum of Hf and Si is 0 at %.

Next, the quartz substrate in which the etching protection film has been formed was placed in a chamber of another sputtering apparatus, a phase shift film composed of MoSiON having a phase shift of 177 degrees and a transmittance of 9%, with respect to light having a wavelength of 193 nm, and a thickness of 75 nm was formed on the etching protection film by using a MoSi target and a Si target as sputtering targets, and argon gas, oxygen gas and nitrogen gas as sputtering gases. A composition of the phase shift film was measured by XPS. As a result, the Mo content was 6.8 at %, the Si content was 38.3 at %, the O content was 14.2 at %, and the N content was 40.7 at %.

Next, the quartz substrate in which the etching protection film and the phase shift film have been formed was placed in a chamber of another sputtering apparatus, a light-shielding film composed of CrON having a thickness of 48 nm was formed on the phase shift film by using a Cr target as a sputtering target, and argon gas, oxygen gas and nitrogen gas as sputtering gases, to obtain a phase shift mask blank. A composition of the light-shielding film was measured by XPS. As a result, the Cr content was 45.7 at %, the O content was 37.3 at %, and the N content was 17.0 at %. In this case, the total optical density (OD) with respect to exposure light having a wavelength of 193 nm in the combination of the phase shift film and the light-shielding film was 3.0.

The obtained phase shift mask blank was placed in the dry etching apparatus shown in FIG. 5, and each of the light-shielding film, the phase shift film, and the etching protection film of the phase shift mask blank was etched by dry etching using a chlorine-based gas (chlorine-based dry etching) or dry etching using a fluorine-based gas (fluorine-based dry etching). Then, etching rates of the films were calculated, respectively. FIG. 5 is a schematic view of an etching apparatus. The etching apparatus 100 includes a chamber 101, a ground 102, a lower electrode 103, an antenna coil 104, and radio frequency power supplies RF1 and RF2. In this case, a substrate to be treated (phase shift mask blank) 105 is placed on the lower electrode 103.

As a result, the etching rate (Rep) of the etching protection film (HfO film) in the dry etching using a fluorine-based gas was 0.054 nm/sec, and the etching rate (Rps) of the phase shift film (MoSiON film) in the dry etching using a fluorine-based gas was 1.15 nm/sec. In this case, the etching selectivity of the phase shift film to the etching protection film was 21. Further, the etching rate of the etching protection film in the dry etching using a chlorine-based gas was 0.16 nm/sec, and the etching rate of the light-shielding film (CrON film) in the dry etching using a chlorine-based gas was 3.61 nm/sec. In this case, the etching selectivity of the light-shielding film to the etching protection film was 23.

Further, a value of 0.00049 was obtained from calculation according to the following expression (1):

$$ODs \times Rep/Rps \tag{1}$$

with the etching rate of the phase shift film (Rps=1.15 nm/sec), the etching rate of the etching protection film (Rep=0.054 nm/sec), and the optical density (ODs=0.0105) with respect to the exposure light per 1 nm thickness of the protection film.

<Etching Conditions for Chlorine-Based Dry Etching>
RF1: Reactive ion etching (RIE) under continuous discharge (CW) at 700V
RF2: Inductively coupled plasma (ICP) under continuous discharge (CW) at 400 W
Pressure: 6 mTorr
$Cl_2$: 185 sccm
$O_2$: 55 sccm
He: 9.25 sccm
<Etching Conditions for Fluorine-Based Dry Etching>
RF1: Reactive ion etching (RIE) under continuous discharge (CW) at 54 W
RF2: Inductively coupled plasma (ICP) under continuous discharge (CW) at 325 W
Pressure: 5 mTorr
$SF_6$: 18 sccm
$O_2$: 45 sccm Example 2

A 152 mm square, 6.35 mm thick 6025 quartz substrate was placed in a chamber of a sputtering apparatus, an etching protection film composed of HfSiO having a thickness of 7.3 nm was formed on the quartz substrate by using a Hf target and a Si target as sputtering targets, and argon gas and oxygen gas as sputtering gases. With respect to light having a wavelength of 193 nm, a transmittance (a ratio of an amount of exposure light transmitted through the transparent substrate and the etching protection film to an amount of the exposure light transmitted through the transparent substrate) was measured in the state in which the etching protective film is formed on the quartz substrate. As a result, the ratio was 96.2% (corresponding to an optical density of 0.017). On the other hand, an optical density (ODs) with respect to the exposure light per 1 nm thickness of the protection film itself was 0.0023. Further, a composition of the etching protection film was measured by XPS. As a result, the Hf content was 13.2 at %, the Si content was 21.4 at %, and the O content was 65.4 at %. In this case, the ratio of Si to the sum of Hf and Si is 61.8 at %.

Next, by the same methods in Example 1, a phase shift film composed of MoSiON having a thickness of 75 nm was formed on the etching protection film, and a light-shielding film composed of CrON having a thickness of 48 nm was formed on the phase shift film, to obtain a phase shift mask blank.

Etching rates of each film in the obtained phase shift mask blank were calculated, respectively, by the same methods in Example 1. As a result, the etching rate (Rep) of the etching protection film (HfSiO film) in the dry etching using a fluorine-based gas was 0.22 nm/sec, and the etching rate (Rps) of the phase shift film (MoSiON film) in the dry etching using a fluorine-based gas was 1.15 nm/sec. In this case, the etching selectivity of the phase shift film to the etching protection film was 5.2. Further, the etching rate of the etching protection film in the dry etching using a chlorine-based gas was 0.16 nm/sec, and the etching rate of the light-shielding film (CrON film) in the dry etching using a chlorine-based gas was 3.61 nm/sec. In this case, the etching selectivity of the light-shielding film to the etching protection film was 23.

Further, a value of 0.00044 was obtained from calculation according to the expression (1) with the etching rate of the phase shift film (Rps=1.15 nm/sec), the etching rate of the etching protection film (Rep=0.22 nm/sec), and the optical density (ODs=0.0023) with respect to the exposure light per 1 nm thickness of the protection film.

Example 3

An etching protection film composed of HfSiO having a thickness of 21 nm was formed on the quartz substrate by the same method in Example 2, however the applied powers of the Hf target and Si target were changed. With respect to light having a wavelength of 193 nm, a transmittance (a ratio of an amount of exposure light transmitted through the transparent substrate and the etching protection film to an amount of the exposure light transmitted through the transparent substrate) was measured in the state in which the etching protective film is formed on the quartz substrate. As a result, the ratio was 89.3% (corresponding to an optical density of 0.049). On the other hand, an optical density (ODs) with respect to the exposure light per 1 nm thickness of the protection film itself was 0.0023. Further, a composition of the etching protection film was measured by XPS. As a result, the Hf content was 3.4 at %, the Si content was 30.8 at %, and the O content was 65.8 at %. In this case, the ratio of Si to the sum of Hf and Si is 90.1 at %.

Next, by the same methods in Example 1, a phase shift film composed of MoSiON having a thickness of 75 nm was formed on the etching protection film, and a light-shielding film composed of CrON having a thickness of 48 nm was formed on the phase shift film, to obtain a phase shift mask blank.

Etching rates of each film in the obtained phase shift mask blank were calculated, respectively, by the same methods in Example 1. As a result, the etching rate (Rep) of the etching protection film (HfSiO film) in the dry etching using a fluorine-based gas was 0.64 nm/sec, and the etching rate (Rps) of the phase shift film (MoSiON film) in the dry etching using a fluorine-based gas was 1.15 nm/sec. In this case, the etching selectivity of the phase shift film to the etching protection film was 1.8. Further, the etching rate of the etching protection film in the dry etching using a chlorine-based gas was 0.18 nm/sec, and the etching rate of the light-shielding film (CrON film) in the dry etching using a chlorine-based gas was 3.61 nm/sec. In this case, the etching selectivity of the light-shielding film to the etching protection film was 20.

Further, a value of 0.00128 was obtained from calculation according to the expression (1) with the etching rate of the phase shift film (Rps=1.15 nm/sec), the etching rate of the etching protection film (Rep=0.64 nm/sec), and the optical density (ODs=0.0023) with respect to the exposure light per 1 nm thickness of the protection film.

Example 4

An etching protection film composed of HfSiO having a thickness of 24 nm was formed on the quartz substrate by the same method in Example 2, however the applied powers of the Hf target and Si target were changed. With respect to light having a wavelength of 193 nm, a transmittance (a ratio of an amount of exposure light transmitted through the transparent substrate and the etching protection film to an amount of the exposure light transmitted through the transparent substrate) was measured in the state in which the etching protective film is formed on the quartz substrate. As a result, the ratio was 88.6% (corresponding to an optical density of 0.053). On the other hand, an optical density (ODs) with respect to the exposure light per 1 nm thickness of the protection film itself was 0.0022. Further, a composition of the etching protection film was measured by XPS. As a result, the Hf content was 2.0 at %, the Si content was 32.1 at %, and the O content was 65.9 at %. In this case, the ratio of Si to the sum of Hf and Si is 94.1 at %.

Next, by the same methods in Example 1, a phase shift film composed of MoSiON having a thickness of 75 nm was formed on the etching protection film, and a light-shielding film composed of CrON having a thickness of 48 nm was formed on the phase shift film, to obtain a phase shift mask blank.

Etching rates of each film in the obtained phase shift mask blank were calculated, respectively, by the same methods in Example 1. As a result, the etching rate (Rep) of the etching protection film (HfSiO film) in the dry etching using a fluorine-based gas was 0.73 nm/sec, and the etching rate (Rps) of the phase shift film (MoSiON film) in the dry etching using a fluorine-based gas was 1.15 nm/sec. In this case, the etching selectivity of the phase shift film to the etching protection film was 1.6. Further, the etching rate of the etching protection film in the dry etching using a chlorine-based gas was 0.18 nm/sec, and the etching rate of the light-shielding film (CrON film) in the dry etching using a chlorine-based gas was 3.61 nm/sec. In this case, the etching selectivity of the light-shielding film to the etching protection film was 20.

Further, a value of 0.00140 was obtained from calculation according to the expression (1) with the etching rate of the phase shift film (Rps=1.15 nm/sec), the etching rate of the etching protection film (Rep=0.73 nm/sec), and the optical density (ODs=0.0022) with respect to the exposure light per 1 nm thickness of the protection film.

Example 5

An etching protection film composed of HfSiO having a thickness of 25 nm was formed on the quartz substrate by the same method in Example 2, however the applied powers of the Hf target and Si target were changed. With respect to light having a wavelength of 193 nm, a transmittance (a ratio of an amount of exposure light transmitted through the transparent substrate and the etching protection film to an amount of the exposure light transmitted through the transparent substrate) was measured in the state in which the etching protective film is formed on the quartz substrate. As a result, the ratio was 88.0% (corresponding to an optical density of 0.056). On the other hand, an optical density (ODs) with respect to the exposure light per 1 nm thickness of the protection film itself was 0.0022. Further, a composition of the etching protection film was measured by XPS. As a result, the Hf content was 0.6 at %, the Si content was 33.4 at %, and the O content was 66.0 at %. In this case, the ratio of Si to the sum of Hf and Si is 98.2 at %.

Next, by the same methods in Example 1, a phase shift film composed of MoSiON having a thickness of 75 nm was formed on the etching protection film, and a light-shielding film composed of CrON having a thickness of 48 nm was formed on the phase shift film, to obtain a phase shift mask blank.

Etching rates of each film in the obtained phase shift mask blank were calculated, respectively, by the same methods in Example 1. As a result, the etching rate (Rep) of the etching protection film (HfSiO film) in the dry etching using a fluorine-based gas was 0.76 nm/sec, and the etching rate (Rps) of the phase shift film (MoSiON film) in the dry etching using a fluorine-based gas was 1.15 nm/sec. In this case, the etching selectivity of the phase shift film to the etching protection film was 1.51. Further, the etching rate of the etching protection film in the dry etching using a chlorine-based gas was 0.19 nm/sec, and the etching rate of the light-shielding film (CrON film) in the dry etching using a chlorine-based gas was 3.61 nm/sec. In this case, the etching selectivity of the light-shielding film to the etching protection film was 19.

Further, a value of 0.00145 was obtained from calculation according to the expression (1) with the etching rate of the phase shift film (Rps=1.15 nm/sec), the etching rate of the etching protection film (Rep=0.76 nm/sec), and the optical density (ODs=0.0022) with respect to the exposure light per 1 nm thickness of the protection film.

Comparative Example 1

A 152 mm square, 6.35 mm thick 6025 quartz substrate was placed in a chamber of a sputtering apparatus, an etching protection film composed of CrSiON having a thickness of 3.4 nm was formed on the quartz substrate by using a Cr target and a Si target as sputtering targets, and argon gas, oxygen gas and nitrogen gas as sputtering gases. With respect to light having a wavelength of 193 nm, a transmittance (a ratio of an amount of exposure light transmitted through the transparent substrate and the etching protection film to an amount of the exposure light transmitted through the transparent substrate) was measured in the state in which the etching protective film is formed on the quartz substrate. As a result, the ratio was 79.6% (corresponding to an optical density of 0.099). On the other hand, an optical density (ODs) with respect to the exposure light per 1 nm thickness of the protection film itself was 0.0291. Further, a composition of the etching protection film was measured by XPS. As a result, the Cr content was 43 at %, the Si content was 7 at %, the O content was 20 at %, and the N content was 30 at %.

Next, by the same methods in Example 1, a phase shift film composed of MoSiON having a thickness of 75 nm was formed on the etching protection film, and a light-shielding film composed of CrON having a thickness of 48 nm was formed on the phase shift film, to obtain a phase shift mask blank.

Etching rates of each film in the obtained phase shift mask blank were calculated, respectively, by the same methods in Example 1. As a result, the etching rate (Rep) of the etching protection film (CrSiON film) in the dry etching using a fluorine-based gas was 0.10 nm/sec, and the etching rate (Rps) of the phase shift film (MoSiON film) in the dry etching using a fluorine-based gas was 1.15 nm/sec. In this case, the etching selectivity of the phase shift film to the etching protection film was 12. Further, the etching rate of the etching protection film in the dry etching using a chlorine-based gas was 0.16 nm/sec, and the etching rate of the light-shielding film (CrON film) in the dry etching using a chlorine-based gas was 3.61 nm/sec. In this case, the etching selectivity of the light-shielding film to the etching protection film was 23.

Further, a value of 0.0025 was obtained from calculation according to the expression (1) with the etching rate of the phase shift film (Rps=1.15 nm/sec), the etching rate of the etching protection film (Rep=0.10 nm/sec), and the optical density (ODs=0.0291) with respect to the exposure light per 1 nm thickness of the protection film.

Japanese Patent Application No. 2020-181972 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A phase shift mask blank comprising a transparent substrate, an etching protection film formed on the transparent substrate, and a phase shift film formed in contact with the etching protection film, wherein
    exposure light is ArF excimer laser,
    the etching protection film is composed of a material containing hafnium, silicon and oxygen, and has a thickness of 1 to 30 nm, and a transmittance of not less than 85% with respect the exposure light,
    in the material containing hafnium, silicon and oxygen, an atomic ratio of silicon to the sum of hafnium and silicon is 61.8 to 99%,
    the material containing hafnium, silicon and oxygen has an oxygen content of not less than 65.4 at %, and
    the phase shift film is composed of a material containing silicon and being free of hafnium, and has a thickness of 50 to 90 nm.

2. The phase shift mask blank of claim 1, wherein the etching protection film and the phase shift film satisfy the value of not more than 0.002 that is calculated by the following expression (1):

$$ODs \times Rep/Rps \qquad (1)$$

wherein Rps and Rep represent etching rates (nm/sec) of the phase shift film and the etching protection film, respectively, in dry etching under the same condition by a fluorine-based gas, and ODs represents an optical density with respect to the exposure light per 1 nm thickness of the protection film.

3. The phase shift mask blank of claim 1, wherein the transparent substrate is a quartz substrate.

4. The phase shift mask blank of claim 1, wherein the etching protection film is formed in contact with the transparent substrate.

5. The phase shift mask blank of claim 1, wherein an etching selectivity of the phase shift film to the etching protection film in dry etching under the same condition by a fluorine-based gas is not less than 1.5.

6. The phase shift mask blank of claim 1, wherein the phase shift film has a phase shift of 150 to 210 degrees with respect to the exposure light.

7. The phase shift mask blank of claim 1, further comprising a third film composed of a material containing chromium, wherein an etching selectivity of the third film to the etching protection film in dry etching under the same condition by a chlorine-based gas is not less than 10.

8. A method for manufacturing a phase shift mask using the phase shift mask blank of claim 1, comprising the step of dry etching the phase shift film by a fluorine-based gas.

9. A method for manufacturing a phase shift mask using the phase shift mask blank of claim 7, comprising the steps of dry etching the phase shift film by a fluorine-based gas, and dry etching the third film by a chlorine-based gas.

10. A phase shift mask comprising a transparent substrate, an etching protection film formed on the transparent substrate, and a phase shift film pattern formed in contact with the etching protection film, wherein
    exposure light is ArF excimer laser,
    the etching protection film is composed of a material containing hafnium, silicon and oxygen, and has a thickness of 1 to 30 nm between the transparent substrate and the phase shift mask pattern, and a transmittance of not less than 85% with respect the exposure light,
    in the material containing hafnium, silicon and oxygen, an atomic ratio of silicon to the sum of hafnium and silicon is 61.8 to 99%,
    the material containing hafnium, silicon and oxygen has an oxygen content of not less than 65.4 at %, and
    the phase shift film pattern is composed of a material containing silicon and being free of hafnium, and has a thickness of 50 to 90 nm.

11. The phase shift mask of claim 10, wherein the etching protection film and the phase shift film satisfy the value of not more than 0.002 that is calculated by the following expression (1):

$$ODs \times Rep/Rps \qquad (1)$$

wherein Rps and Rep represent etching rates (nm/sec) of the phase shift film and the etching protection film, respectively, in dry etching under the same condition by a fluorine-based gas, and ODs represents an optical density with respect to the exposure light per 1 nm thickness of the protection film.

12. The phase shift mask of claim 10, wherein the transparent substrate is a quartz substrate.

13. The phase shift mask of claim 10, wherein the etching protection film is formed in contact with the transparent substrate.

14. The phase shift mask of claim 10, wherein an etching selectivity of the phase shift film to the etching protection film in dry etching under the same condition by a fluorine-based gas is not less than 1.5.

15. The phase shift mask of claim 10, wherein the phase shift film has a phase shift of 150 to 210 degrees with respect to the exposure light.

16. The phase shift mask of claim 10, further comprising a pattern of a third film composed of a material containing chromium, wherein an etching selectivity of the third film to the etching protection film in dry etching under the same condition by a chlorine-based gas is not less than 10.

17. The phase shift mask blank of claim 1, wherein the etching protection film is formed between the transparent substrate and the phase shift film.

18. The phase shift mask blank of claim 1, wherein the material containing hafnium, silicon and oxygen has a hafnium content of not less than 0.5 at % and not more than 13.2 at %.

19. The phase shift mask of claim 10, wherein the material containing hafnium, silicon and oxygen has a hafnium content of not less than 0.5 at % and not more than 13.2 at %.

* * * * *